United States Patent
Liang et al.

(10) Patent No.: US 7,071,093 B2
(45) Date of Patent: Jul. 4, 2006

(54) INTEGRATED TREATMENT METHOD FOR OBTAINING ROBUST LOW DIELECTRIC CONSTANT MATERIALS

(75) Inventors: Mong-Song Liang, Hsin-Chu (TW); Yung-Cheng Lu, Hsin-Chu (TW); Huilin Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/810,970

(22) Filed: Mar. 26, 2004

(65) Prior Publication Data
US 2005/0215052 A1    Sep. 29, 2005

(51) Int. Cl.
*H01L 21/4763* (2006.01)

(52) U.S. Cl. ...................... 438/624; 438/654

(58) Field of Classification Search ........... 438/600, 438/624, 628, 633, 654
See application file for complete search history.

(56) References Cited

U.S. PATENT DOCUMENTS

| | | | | |
|---|---|---|---|---|
| 5,287,081 | A * | 2/1994 | Kinard et al. | 338/24 |
| 6,051,443 | A * | 4/2000 | Ghio et al. | 438/17 |
| 6,333,215 | B1 * | 12/2001 | Matsuda et al. | 438/149 |
| 6,383,951 | B1 | 5/2002 | Li | |
| 6,465,372 | B1 | 10/2002 | Xia et al. | |
| 6,486,061 | B1 | 11/2002 | Xia et al. | |
| 6,559,070 | B1 | 5/2003 | Mandal | |
| 6,583,046 | B1 | 6/2003 | Okada et al. | |
| 6,583,048 | B1 | 6/2003 | Vincent et al. | |
| 6,602,801 | B1 * | 8/2003 | Kong et al. | 438/778 |
| 6,635,575 | B1 | 10/2003 | Xia et al. | |
| 6,861,339 | B1 * | 3/2005 | Chen et al. | 438/488 |
| 6,899,857 | B1 * | 5/2005 | Pheng et al. | 423/338 |
| 2003/0008528 | A1 | 1/2003 | Xia et al. | |
| 2003/0041803 | A1 * | 3/2003 | Kunitomo et al. | 118/715 |
| 2003/0077857 | A1 | 4/2003 | Xia et al. | |
| 2003/0100691 | A1 | 5/2003 | Lee et al. | |
| 2003/0198742 | A1 | 10/2003 | Vrtis et al. | |
| 2003/0211244 | A1 | 11/2003 | Li et al. | |
| 2003/0232137 | A1 | 12/2003 | Vrtis et al. | |
| 2003/0232495 | A1 | 12/2003 | Moghadam et al. | |
| 2004/0023485 | A1 * | 2/2004 | Pan et al. | 438/637 |
| 2005/0042884 | A1 * | 2/2005 | Hyodo et al. | 438/778 |
| 2005/0124168 | A1 * | 6/2005 | Nagahara et al. | 438/745 |

OTHER PUBLICATIONS

"IITC 2003: Searching for Better Low-K Solutions", Jun. 16, 2003, 2 pages, V10n24, JSR Micro Materials Innovation.

* cited by examiner

*Primary Examiner*—Phuc T. Dang
(74) *Attorney, Agent, or Firm*—Haynes and Boone, LLP

(57) ABSTRACT

An integrated method comprises providing a low dielectric material, applying a first treatment altering a first property of the low dielectric material, and applying a second treatment altering a second property of the treated low dielectric material and producing a lower dielectric material with better mechanical stability.

17 Claims, 3 Drawing Sheets

INTEGRATED TREATMENT METHOD FOR OBTAINING ROBUST LOW DIELECTRIC CONSTANT MATERIALS

BACKGROUND

In the field of semiconductor device fabrication, inter-level dielectric (ILD) materials are used to separate conductive elements such as metal interconnect lines. As device sizes shrink, the smaller spacing between these conductive elements leads to increased parasitic capacitance that causes problems such as delays in signal transmission. Low dielectric constant (k) materials are desirable for use as inter-level dielectrics to minimize the parasitic capacitance. Because air has the lowest dielectric constant of one, materials that are porous have a low dielectric constant. Numerous fabrication processes have heretofore been used to produce porous low dielectric materials. However, the resultant low dielectric materials are generally fragile, soft, and mechanically unstable. These materials are often unable to withstand the mechanical and/or chemical processes that follow in the fabrication process.

DETAILED DESCRIPTION

Low dielectric constant (low k) materials are eagerly sought after for inter-level dielectric applications. The use of low dielectric materials decreases parasitic capacitances and cross-talk between neighboring conductors and improves electrical signal transmission. Traditional formation methods lead to a material that is soft, fragile with low cracking threshold, high film stress, chemical or thermal resistance, and/or other undesirable characteristics. Known low dielectric materials that may be used for inter-level dielectric applications include fluoride-doped silicate glass (FSG), BLACK DIAMOND (Applied Materials of Santa Clara, Calif.), xerogel, aerogel, amorphous fluorinated carbon, parylene, bis-benzocyclobutenes (BCB), SILK (Dow Chemical of Midland, Mich.), and DENDRIGLASS (IBM of White Plains, N.Y.).

Some low dielectric materials such as SILK and DENTRIGLASS are formed by the us of pore generators or porogen. During the formation of the dielectric material, the host material forms a matrix of cross links and the porogen separates from the matrix. Upon subsequent processing, the porogen is evacuated or removed and a network of pores is left behind.

Figure 1:
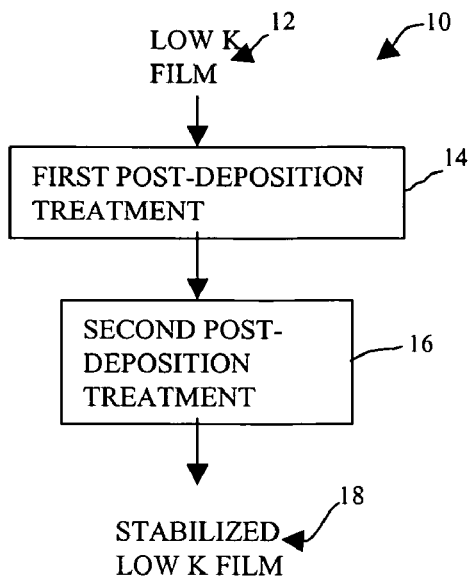
FIG. 1 is a simplified flowchart of an integrated post-deposition treatment method.

FIG. 1 is a simplified flowchart of one embodiment of an integrated post-deposition treatment method 10 for a low dielectric material 12. Low dielectric material 12 may comprise a film that has been deposited onto a semiconductor substrate by a number of methods such as chemical vapor deposition (CVD), plasma-enhanced chemical vapor deposition (PECVD), spin-on deposition (SOD), etc. Integrated method 10 comprises treating low dielectric material 12 using a first post-deposition treatment 14 in combination with a second post-deposition treatment 16 to achieve a more mechanically stable material that has improved dielectric constant and other characteristics. For example, the resultant material may have increased hardness, lowered film stress and lower cracking threshold. Low dielectric materials produced in such a manner is better able to withstand subsequent processing steps such as chemical mechanical planarization (CMP) and still retain a low dielectric constant.

Depending on the application, first post-deposition treatment 14 may be performed prior to second post-deposition treatment 16, or the two treatment steps may be performed substantially simultaneously with the use of suitable equipment.

Subjecting low dielectric materials to various treatment methods have yielded a general finding of the results of these treatment methods:

|  | Thermal | Hydrogen Plasma | Microwave Hydrogen Plasma | Electron Beam | Ultraviolet Radiation |
|---|---|---|---|---|---|
| K Value | ✓ | ✓ | ✓ | — | — |
| Hardness | X | X | ✓ | ✓ | ✓ |
| Cracking Threshold | ✓ | ✓ | — | X | X |
| Chemistry/ Thermal Resistance | X | X | X | ✓ | ✓ |

In the above table, the rows display material properties and the columns display treatment methods. The check marks, ✓, indicate that the treatment method improved that particular material property, the X marks indicate that the treatment method worsened that particular material property, and the dash mark, -, indicate that the treatment method did not significantly alter that particular material property. It may be seen that, for example, thermal treatment alone generally improved the dielectric constant and cracking threshold of the material, but made its hardness and chemistry/thermal resistance worse.

Figure 2:
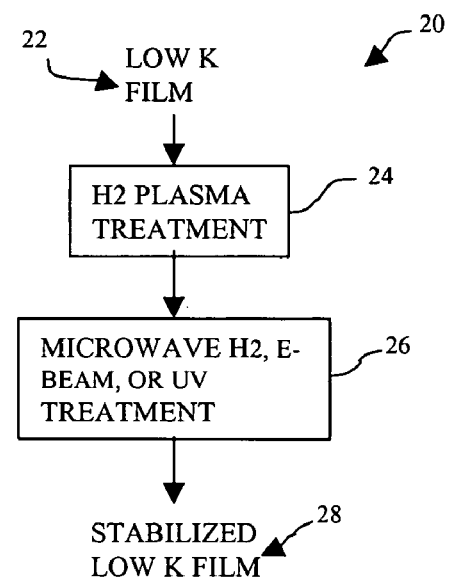
FIG. 2 is a simplified flowchart of an integrated post-deposition treatment method according to an embodiment of the invention.

FIG. 2 is a simplified flowchart of an integrated method 20 to stabilize a low dielectric material according to an embodiment of the invention. Method 20 is particularly suited for curing a non-porogen low dielectric material 22. A non-porogen material is one that does not rely on pore generators to form a porous network in the material. Non-porogen low dielectric material 22 is first subjected to a hydrogen plasma process 24, and then subjected to one of microwave hydrogen plasma, electron beam, or ultraviolet radiation processes 26. Hydrogen plasma process 24 comprises subjecting low dielectric material 22 to hydrogen plasma in a chamber for about 30 to about 600 seconds, at about 200 to about 450 degrees Celsius. The chamber pressure is preferably maintained at about 10 mTorr to about 100 mTorr, with the radio frequency (RF) power in the range of about 300 Watts to about 3000 Watts to ionize the hydrogen gas. The use of hydrogen plasma makes the low dielectric material softer and less chemical resistance, both undesirable characteristics.

The second step in the integrated method may be a microwave hydrogen plasma process. Microwave hydrogen plasma process 26 comprises subjecting low dielectric material 22 to a microwave hydrogen plasma in a chamber. The time duration for the exposure may range about 30 to about 600 seconds, and the wafer temperature may range about 200 to about 450 degrees Celsius. The chamber pressure may range about 10 mTorr to about 100 mTorr, with the microwave power in the range of about 300 Watts to about 3000 Watts.

Alternatively, the second step in integrated method 20 may be an electron beam treatment performed after the first step of hydrogen plasma process or concurrently therewith. Electron beam treatment comprises subjecting the material to a beam of electrons. Preferably, the electron beam is of an energy sufficient to penetrate the entire thickness of the low dielectric material. The low dielectric material may be exposed to an electron beam at an energy ranging from about 1 KeV to about 100 KeV (kilo-electron volt) for about 30 seconds to 600 seconds, for example. The wafer temperature may be held at about 200 to 450 degrees Celsius and the chamber pressure may be maintained at about 10 mTorr to 100 mTorr.

Another alternative for the second process in integrated method 20 is ultraviolet radiation. The ultraviolet radiation treatment may be performed after the first step of hydrogen plasma process or concurrently therewith. Ultraviolet radiation at about 1 mWatt to about 3000 Watts is applied to the low dielectric material for about 30 to 1200 seconds. The wafer temperature may be maintained at about 20 to 450 degrees Celsius and the chamber pressure may range about 10 mTorr to about 100 mTorr.

The result after the integrated treatment method 20 is a material that has a lower dielectric constant and has better mechanical stability that can withstand subsequent fabrication processes. More specifically, the resultant low dielectric material is harder and has better chemistry resistance. The integrated method also produces a better low dielectric material than any of the single treatment processes can provide.

Figure 3:
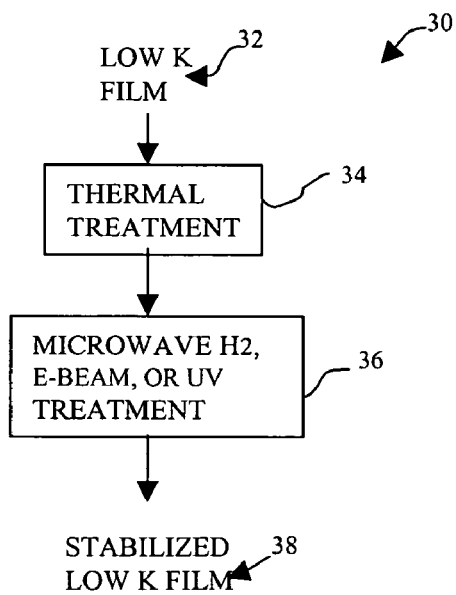
FIG. 3 is a simplified flowchart of an integrated post-deposition treatment method according to another embodiment of the invention.

FIG. 3 is a simplified flowchart of an integrated post-deposition treatment method 30 according to another embodiment of the invention. A low dielectric material 32 such as a non-porogen material is first subjected to a thermal treatment process 34. For example, the wafer may be heated to about 200 to 450 degrees Celsius for about 10 minutes to about 12 hours in a chamber having a pressure at about 10 mTorr to about 760 Torr. The use of thermal post-deposition treatment makes the low dielectric material softer and less chemical resistance, both undesirable characteristics. Subsequently or concurrently therewith, a second treatment process 36 is applied. Second treatment process 36 of integrated method 30 comprises subjecting the low dielectric material to microwave hydrogen plasma. The time duration for the exposure may range about 30 to about 600 seconds, and the wafer temperature may range about 200 to about 450 degrees Celsius. The chamber pressure may range about 10 mTorr to about 100 mTorr, with the microwave power in the range of about 300 Watts to about 3000 Watts. The second processing step of microwave hydrogen plasma hardens the material in addition to lower the film shrinkage and stress problems. The result is a more robust and stable low dielectric material that has a lower dielectric constant.

Alternatively, the second post-deposition treatment process in method 30 may comprise electron beam applied subsequently to the thermal treatment or concurrently therewith. The low dielectric material may be exposed to an electron beam at an energy ranging from about 1 KeV to about 100 KeV for about 30 seconds to 600 seconds, for example. The wafer temperature may be held at about 200 to 450 degrees Celsius and the chamber pressure may be maintained at about 10 mTorr to 100 mTorr. Alternatively, ultraviolet radiation at about 1 mWatt to about 3000 Watts may be applied to the low dielectric material for about 30 to 1200 seconds as another alternate second treatment process in method 30. The wafer temperature may be maintained at about 20 to 450 degrees Celsius and the chamber pressure may be held at 10 mTorr to 100 mTorr. These second processing steps also improves the hardness and the cracking and stress problems of the low dielectric material.

The result after the integrated treatment method 30 is a material that has a lower dielectric constant and has better mechanical stability. This material is better able to withstand subsequent fabrication processes like chemical mechanical planarization. In particular, the resultant low dielectric material is harder and has better chemistry resistance. The integrated method also produces a better low dielectric material than any of the single treatment processes can provide.

Figure 4:
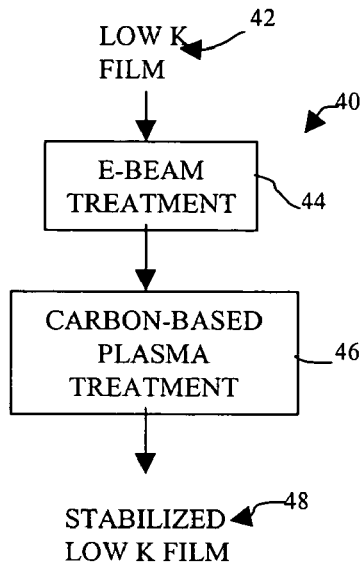
FIG. 4 is a simplified flowchart of an integrated post-deposition treatment method according to another embodiment of the invention.

FIG. 4 is a simplified flowchart of an integrated post-deposition treatment method 40 according to another embodiment of the invention. Integrated method 40 may be used on a non-porogen low dielectric material 42. Integrated method 40 comprises a first step of applying an electron beam 44 to the low dielectric material. The electron beam-treated low dielectric material suffers from a low cracking threshold and high film stress. A second step performed subsequent to or concurrent with the first step may comprise treating the low dielectric material with a carbon-based plasma. The material is subjected to the carbon-based plasma for about 30 seconds to about 600 seconds in a chamber pressure of about 10 mTorr to about 100 mTorr. The wafer temperature may be held at about 200 to about 450 degrees Celsius. The RF power may range between about 300 Watts to about 3000 Watts. The resultant material has a lower dielectric constant and the problems of high film stress and low cracking threshold have been corrected by the use of the second step described above in combination with the first step of electron beam treatment.

Figure 5:
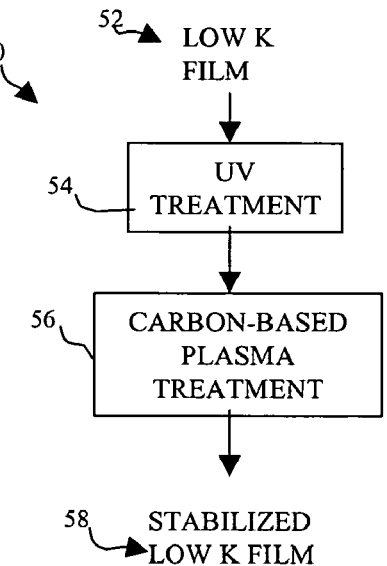
FIG. 5 is a simplified flowchart of an integrated post-deposition treatment method according to another embodiment of the invention.

FIG. 5 is a simplified flowchart of an integrated post-deposition treatment method 50 according to another embodiment of the invention. Integrated method 50 first subjects a low dielectric non-porogen material 52 to ultraviolet radiation. Ultraviolet radiation at about 1 mWatt to about 3000 Watts is applied to the low dielectric material for about 30 to 1200 seconds. The wafer temperature may be maintained at about 20 to 450 degrees Celsius and the chamber pressure may be held at 10 mTorr to 100 mTorr. The ultraviolet light-treated material generally has a low cracking threshold and high film stress. A second step performed subsequent to or concurrent with the first step may comprise treating the low dielectric material with a carbon-based plasma. The material is subjected to the carbon-based plasma for about 30 seconds to about 600 seconds in a chamber pressure of about 10 mTorr to about 100 mTorr. The wafer temperature may be held at about 200 to about 450 degrees Celsius. The RF power may range between about 300 Watts to about 3000 Watts. After the second step in the integrated method, the low cracking threshold and high film stress problems of the low dielectric have been corrected without increasing the dielectric constant of the material.

Figure 6:
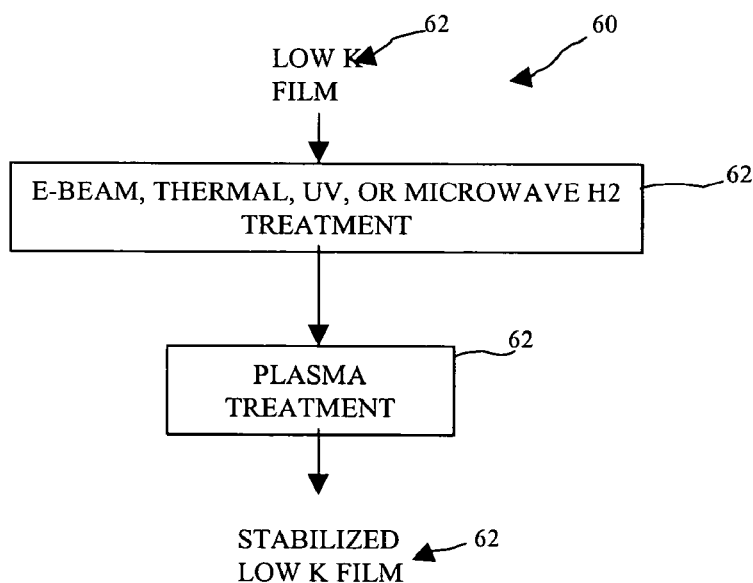
FIG. 6 is a simplified flowchart of an integrated post-deposition treatment method according to another embodiment of the invention.

For porogen low dielectric materials, an embodiment of an integrated treatment method 60 is described in FIG. 6. A porogen material contains pore generators that are capable of generating a porous network in the low dielectric material. Integrated treatment method 60 comprises a first step of treating the low dielectric material with electron beam, thermal, or microwave hydrogen plasma 62. This first step of integrated method 60 is operable to remove a significant number of the pore generators or porogens from the material. However, such processes generally introduce stress or cracks in the low dielectric material. Subsequently or concurrently therewith, a second step of applying a hydrogen-based or carbon-based plasma is used to "heal" the structure of the material. The second step is operable to generally relieve the crack and/or the stress in the low dielectric material. The result is a more mechanically stable material with a lower dielectric constant.

Figure 7:
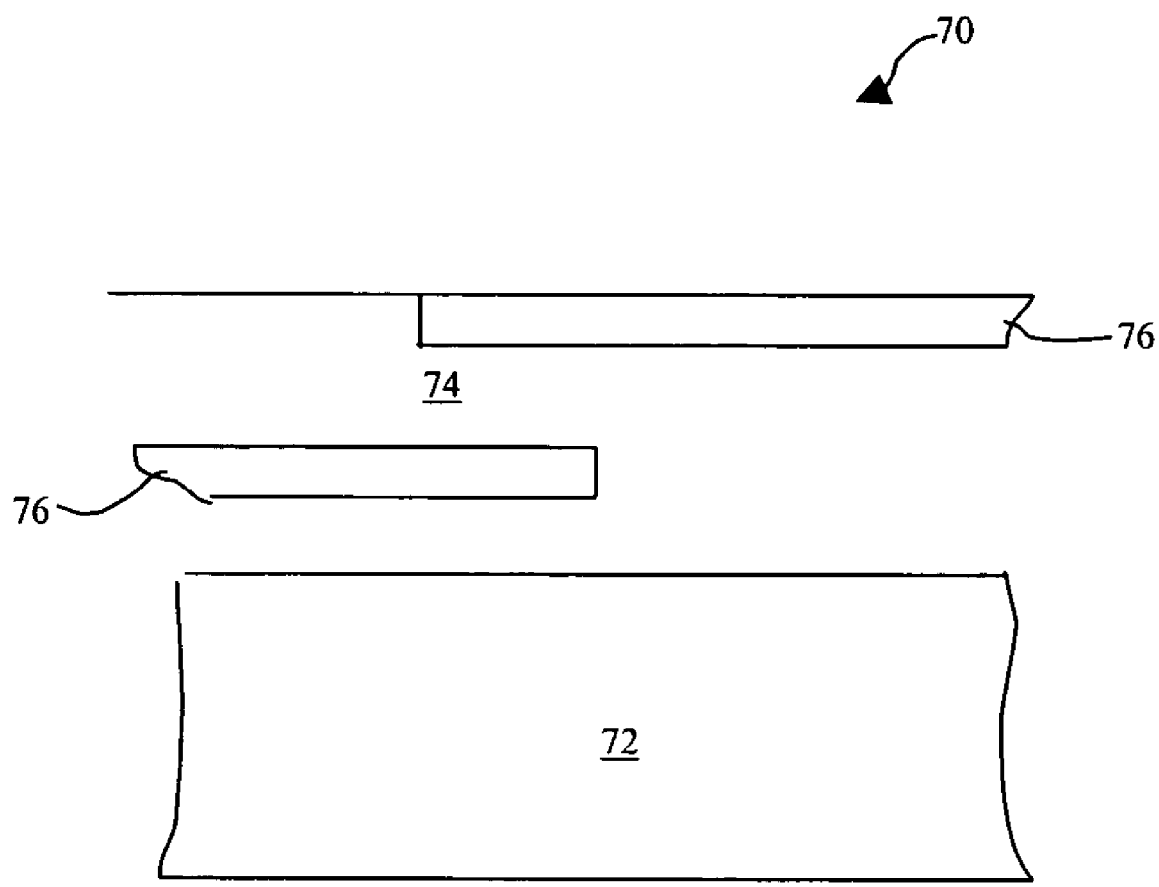
FIG. 7 is a simplified cross-sectional view of an exemplary semiconductor device.

FIG. 7 is a simplified cross-sectional view of an exemplary semiconductor device 70 having a substrate 72 and using an improved low dielectric material as inter-level dielectric layers 74 between conductive elements 76 such as metal interconnect lines. The improved low dielectric material is one which has been treated with the integrated processing method of the invention that comprises at least two curing steps as described in detail above. By using an integrated method comprising at least two processing steps to cure the low dielectric material, the structural integrity of the low dielectric material and thus the device is improved without increasing the dielectric constant of the material. In most instances, the dielectric constant of the material is significantly lowered after the application of the integrated method processes.

What is claimed is:

1. An integrated method comprising:
   providing a low dielectric material;
   applying a first treatment altering a first property of the low dielectric material, the first treatment being a treatment other than a thermal treatment; and
   applying a second treatment altering a second property of the treated low dielectric material and producing a lower dielectric material with better mechanical stability.

2. An integrated method comprising:
   providing a low dielectric material;
   applying a first treatment altering a first property of the low dielectric material, the first treatment being a treatment other than a thermal treatment; and
   applying a second treatment altering a second property of the treated low dielectric material and producing a lower dielectric material with better mechanical stability, wherein applying a first treatment comprises subjecting the low dielectric material to a treatment selected from a group consisting of hydrogen-based plasma, electron beam, ultraviolet radiation, and microwave hydrogen plasma.

3. An integrated method comprising:
   providing a low dielectric material;
   applying a first treatment altering a first property of the low dielectric material, the first treatment being a treatment other than a thermal treatment; and
   applying a second treatment altering a second property of the treated low dielectric material and producing a lower dielectric material with better mechanical stability, wherein applying a second treatment comprises subjecting the low dielectric material after the first treatment to a treatment selected from a group consisting of hydrogen-based plasma, electron beam, ultraviolet radiation, and carbon-based plasma, microwave hydrogen plasma.

4. An integrated method comprising:
   providing a low dielectric material;
   applying a first treatment altering a first property of the low dielectric material; and
   applying a second treatment altering a second property of the treated low dielectric material and producing a lower dielectric material with better mechanical stability, the second treatment being a treatment other than a thermal treatment.

5. An integrated method comprising:
   providing a low dielectric material;
   applying a first treatment altering a first property of the low dielectric material; and
   applying a second treatment altering a second property of the treated low dielectric material and producing a lower dielectric material with better mechanical stability, the second treatment being a treatment other than a thermal treatment, wherein applying a first treatment comprises subjecting the low dielectric material to a treatment selected from a group consisting of hydrogen-based plasma, electron beam, high temperature, ultraviolet radiation, and microwave hydrogen plasma.

6. An integrated method comprising:
   providing a low dielectric material;
   applying a first treatment altering a first property of the low dielectric material; and
   applying a second treatment altering a second property of the treated low dielectric material and producing a lower dielectric material with better mechanical stability, the second treatment being a treatment other than a thermal treatment, wherein applying a second treatment comprises subjecting the low dielectric material after the first treatment to a treatment selected from a group consisting of hydrogen-based plasma, electron beam, ultraviolet radiation, and carbon-based plasma, microwave hydrogen plasma.

7. An integrated method comprising:
   providing a low dielectric material;
   applying a first treatment altering a first property of the low dielectric material, the first treatment treating the low dielectric material with hydrogen-based plasma; and
   applying a second treatment altering a second property of the treated low dielectric material and producing a lower dielectric material with better mechanical stability.

8. An integrated method comprising:
   providing a low dielectric material;
   applying a first treatment altering a first property of the low dielectric material, the first treatment treating the low dielectric material with hydrogen-based plasma; and
   applying a second treatment altering a second property of the treated low dielectric material and producing a lower dielectric material with better mechanical stability, wherein applying the second treatment comprises a treatment selected from a group consisting of treating the low dielectric material with microwave hydrogen plasma and ultraviolet radiation.

9. An integrated method comprising:
providing a low dielectric material;
applying a first treatment altering a first property of the low dielectric material, the first treatment treating the low dielectric material with ultraviolet radiation; and
applying a second treatment altering a second property of the treated low dielectric material and producing a lower dielectric material with better mechanical stability.

10. An integrated method comprising:
providing a low dielectric material;
applying a first treatment altering a first property of the low dielectric material, the first treatment treating the low dielectric material with ultraviolet radiation; and
applying a second treatment altering a second property of the treated low dielectric material and producing a lower dielectric material with better mechanical stability, wherein applying the second treatment comprises a treatment selected from a group consisting of treating the low dielectric material with carbon-based plasma and a hydrogen plasma.

11. An integrated method comprising:
providing a low dielectric material;
applying a first treatment altering a first property of the low dielectric material, the first treatment treating the low dielectric material with microwave hydrogen plasma; and
applying a second treatment altering a second property of the treated low dielectric material and producing a lower dielectric material with better mechanical stability.

12. The integrated method of claim 11, wherein applying the second treatment comprises treating the low dielectric material with carbon-based plasma.

13. The integrated method of claim 11, wherein applying the second treatment comprises treating the low dielectric material with hydrogen plasma.

14. An integrated method comprising:
providing a low dielectric material;
applying a first treatment altering a first property of the low dielectric material;
applying a second treatment altering a second property of the treated low dielectric material and producing a lower dielectric material with better mechanical stability; and
wherein one of the first and second treatment comprises treating the low dielectric material with a plasma.

15. An integrated method comprising:
providing a low dielectric material;
applying a first treatment altering a first property of the low dielectric material;
applying a second treatment altering a second property of the treated low dielectric material and producing a lower dielectric material with better mechanical stability; and
wherein one of the first and second treatment comprises treating the low dielectric material with ultraviolet radiation.

16. An integrated method comprising:
providing a low dielectric material;
applying a first treatment altering a first property of the low dielectric material;
applying a second treatment altering a second property of the treated low dielectric material and producing a lower dielectric material with better mechanical stability; and
wherein one of the first and second treatment comprises treating the low dielectric material with an electron beam.

17. An integrated method comprising:
providing a low dielectric material;
applying a first treatment altering a first property of the low dielectric material, the first treatment treating the low dielectric material with high temperature; and
applying a second treatment altering a second property of the treated low dielectric material and producing a lower dielectric material with better mechanical stability, the second treatment treating the low dielectric material with a plasma.

* * * * *